(12) United States Patent
Sakaguchi et al.

(10) Patent No.: US 6,303,255 B1
(45) Date of Patent: Oct. 16, 2001

(54) ORGANIC EL PANEL AND METHOD OF MANUFACTURING THE SAME

(75) Inventors: Yoshikazu Sakaguchi; Yuichi Iketsu, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/175,722

(22) Filed: Oct. 20, 1998

(30) Foreign Application Priority Data

Oct. 24, 1997 (JP) .................................. 9-292082

(51) Int. Cl.⁷ .................................................. G03G 13/06
(52) U.S. Cl. ............................................. 430/97; 430/110.1
(58) Field of Search ............................. 430/97, 110, 110.1

(56) References Cited

FOREIGN PATENT DOCUMENTS 5-108014   4/1993  (JP) .
7-121056   5/1995  (JP) .

*Primary Examiner*—Mark Chapman
(74) *Attorney, Agent, or Firm*—Young & Thompson

(57) ABSTRACT

A method of manufacturing an organic EL panel, in which an organic electroluminescent material is formed between a pair of opposing electrodes, is provided. At least one of the electrodes is transparent or opaque. An emission pixel is obtained through the steps of forming a photoconductor having a charge generation layer and a charge transport layer on the transparent electrode side, charging the photoconductor and thereafter exposing the photoconductor to form an electrostatic latent image at the prospective emission pixel portion, developing the electrostatic latent image by using toner kneaded with an electroluminescent medium, and fixing the toner on the photoconductor after development. An EL panel manufactured by the above method is also disclosed.

4 Claims, 7 Drawing Sheets

ORGANIC EL PANEL AND METHOD OF MANUFACTURING THE SAME

BACKGROUND OF THE INVENTION

1. Field of the Invention

The present invention relates to an organic EL panel (organic electroluminescence panel) and a method of manufacturing the same.

2. Description of the Prior Art

A method of manufacturing an inorganic EL panel disclosed in Japanese Unexamined Patent Publication No. 5-108014 will be described as a conventional example. According to this example, as shown in FIG. 1, a mask 18 having a window pattern corresponding to the emission film portions for pixels of a display color is disposed near a panel substrate 1 on which a transparent electrode film 2 and an insulating film 16 are formed. In this state, emission layers 17 of the same display color are selectively formed simultaneously at positions of the window pattern by vacuum deposition. Hence, emission portions of different display colors are sequentially formed at different positions in units of colors.

Japanese Unexamined Patent Publication No. 7-121056 discloses a method of manufacturing the color filter of a plasma display or liquid crystal display. According to this method, a substrate formed with a photosensitive body layer having an organic photoconductive layer is charged to desired polarity, and is selectively exposed to form a latent image. Then, toner is attached to this substrate to form a pattern. This substrate is calcined to remove the organic photoconductive layer, thereby obtaining a desired pattern.

As a method of manufacturing the color filter of a liquid crystal display, a pigment dispersing method utilizing photolithography is also known. According to this method, a substrate is coated with a photoconductive polymer dispersed with a color pigment, and is exposed through a photomask. After that, this substrate is developed and etched to form a color pattern. This method is repeated for each of red, green, and blue.

With the above method of sliding the mask in accordance with the colors, the substrate deforms or deflects due to the weight of the mask or thermal expansion caused by radiation heat during deposition, and fine positional control of the mask is difficult to perform. Therefore, the layers overlap each other and insufficient separation occurs easily. Also, it is difficult to form a large-size screen. To obtain a mask, a pattern is formed in a thin metal plate by photoetching. The finer the pattern is, the more easily the pattern is disconnected, making it difficult to fabricate the mask itself. In order to prevent short-circuiting of the respective pixels, the mask and the substrate must be separated from each other. However, the deposition material rounds about during deposition, and accordingly further shrinkage in device geometries is limited.

Since an organic EL panel uses an organic material having no heat resistance as the material of an emission layer, a hole transport layer, and the like, it cannot employ the method of which uses a photosensitive body and develops toner dispersed with an inorganic pigment and calcines the toner to remove the photosensitive body. Since a white electroluminescent material is not currently available for an organic EL panel, it is difficult to utilize a color filter.

Assume that the pigment dispersing method is applied to a color organic EL panel. In this case, the organic EL panel which is very weak against water utilizes a wet process for patterning wherein a photosensitive polymer is applied to the substrate, is exposed through a photomask, and is developed and etched. Accordingly, generation and growth of a dark spot, and generation of a pixel defect due to separation of an organic layer-cathode interface, readily occur.

SUMMARY OF THE INVENTION

The present invention has been made in consideration of the above situation in the prior art, and has as its object to provide an organic EL panel in which damage to the organic EL panel is small and which attains a smaller feature size and colored with a simple method, and a method of manufacturing the same.

In order to achieve the above object, according to the first aspect of the present invention, there is provided a method of manufacturing an organic EL panel in which an organic electroluminescent material is formed between a pair of opposing electrodes at least one of which is transparent or opaque, wherein an emission pixel is obtained through the steps of forming a photoconductor having a charge generation layer and a charge transport layer on a transparent electrode side, charging the photoconductor and thereafter exposing the photoconductor to form an electrostatic latent image at an emission pixel portion, developing the electrostatic latent image by using toner kneaded with an electroluminescent medium, and fixing the toner on the photoconductor after development.

According to the second aspect of the present invention, there is provided a method of manufacturing an organic EL panel in which an organic electroluminescent material is formed between a pair of opposing electrodes at least one of which is transparent or opaque, wherein an emission pixel is obtained through the steps of forming a photoconductor having a charge generation layer and a charge transport layer on a transparent electrode side, charging the photoconductor and thereafter exposing the photoconductor to form an electrostatic latent image at a portion other than an emission pixel portion, developing the electrostatic latent image by using toner kneaded with an electroluminescent medium, forming an emission layer portion by deposition while using a developed portion as a mask, and removing the toner from a panel substrate after deposition to obtain the emission pixel.

In this manner, with the organic EL panel manufacturing method according to the present invention, an organic photoconductor is formed on a transparent electrode formed on a transparent substrate, e.g., a glass substrate, and is charged. The photoconductor is selectively exposed in a prospective pixel pattern portion to form an electrostatic latent image. Then, toner kneaded with an organic electroluminescent medium is applied on the electrostatic latent image, thereby forming a pixel pattern. Alternatively, an organic photoconductor formed on the transparent electrode side is charged and exposed to form an electrostatic latent image at a portion other than the prospective emission pixel. The electrostatic latent image is developed using toner. An emission layer portion is formed by deposition while using the developed portion as the mask. After that, the toner is removed from the panel substrate, thereby obtaining an emission pixel. The pixel pitch and space width of the panel obtained are determined by the exposure precision and toner particle diameter; a micropattern having a size of as small as about 10 $\mu$m can be formed.

With the above method, when a thin film is formed by vacuum deposition using the mask, roundabout caused by mask floating does not take place. Consequently, color misregistration or misalignment does not occur, and a panel having a sharp edge can be fabricated. Since mask alignment need not be performed to decrease the vacuum process, the speed of the panel fabricating process can be increased.

As is apparent from the above aspects, according to the present invention, an organic photoconductor is formed on the transparent electrode, and is selectively exposed and developed to form an emission pattern. When compared to a method wherein masking is used in vacuum deposition, which is conventionally employed in an organic EL, roundabout of the material or insufficient separation caused by distortion or misalignment of the mask is eliminated, and a high size precision and positional precision can be ensured.

The resolution of the emission pattern depends on the exposing unit and the particle diameter of the toner. Hence, the device geometries can be reduced to a level of as small as about 10 μm.

Since an emission/electron transport material and the like are dispersed in a binder, the adhesion properties of the respective interfaces of the layers increase to eliminate cohesion of the material or denaturing of the film. This increases the heat resistance of the organic EL panel and can prolong the life of the organic EL panel.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

The basic aspect of the present invention will be described with reference to the accompanying drawings.

Figure 1:
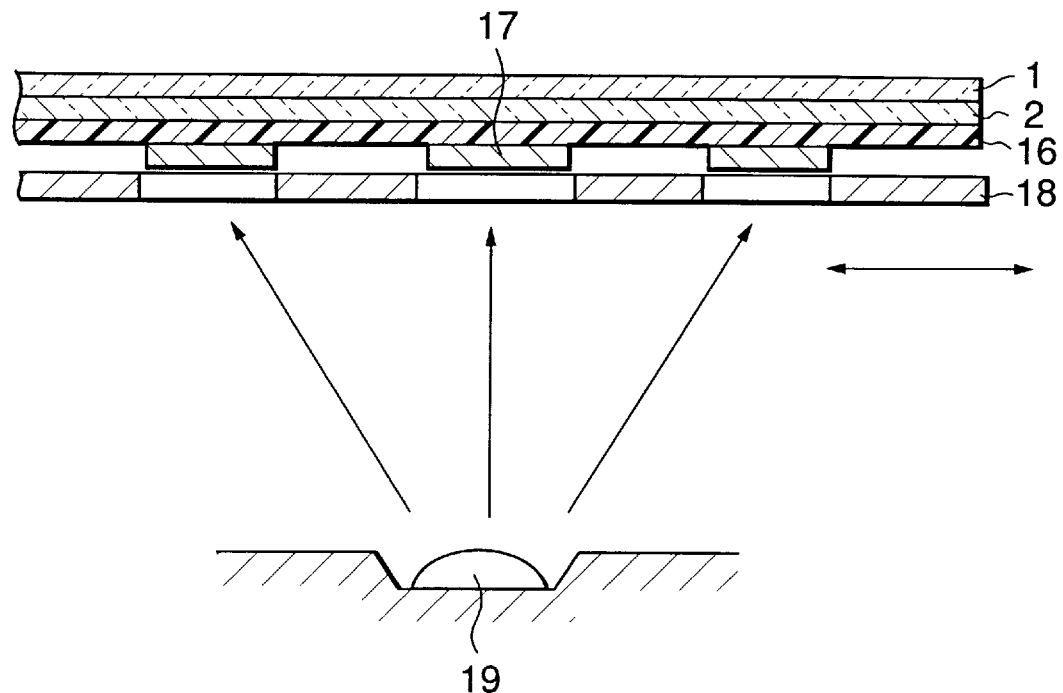
FIG. 1 is a sectional view showing a conventional inorganic EL panel manufacturing process.
Figure 2:
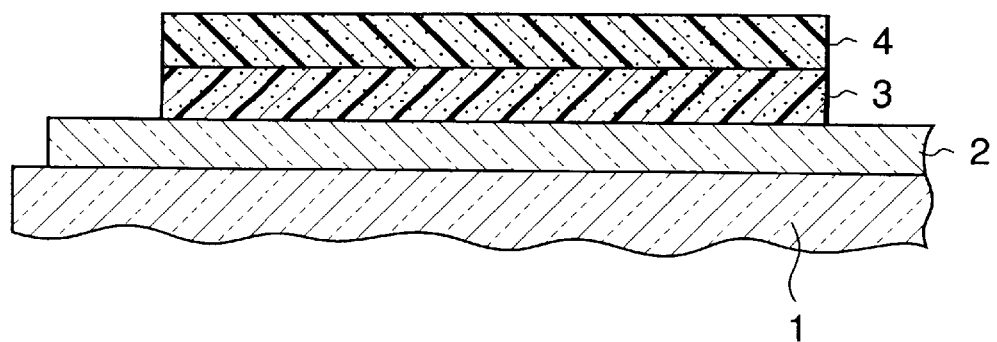
FIG. 2 is a sectional view showing an organic EL panel manufacturing process according to an embodiment of the present invention.

An ITO thin film 2 as a transparent electrode is formed on a transparent substrate 1, e.g., a glass substrate. An organic photoconductor layer consisting of a charge generation layer 3 and a charge transport layer 4 is formed on the transparent electrode 2 (see FIG. 2).

The charge generation layer 3 is formed by using a coating liquid which is obtained by dispersing, in a butyral resin, a charge generating agent, e.g., a metal-free material, copper, or a phthalocyanine compound such as titanyl or vanadyl, or a perylene-based coloring matter, a polycyclic quinone-based coloring matter, a squalilium coloring matter, or an azulenium coloring matter.

The charge transport layer 4 is formed by using a coating liquid which is obtained by dispersing, in a polycarbonate resin, an arylamine-based compound, e.g., triphenyldiamine, a heterocyclic compound, e.g., oxadiazole, oxazole, or pyrazoline, a hydrazone-based compound, or a hole-mobile compound, e.g., a condensed polycyclic compound.

The thin film may be formed in accordance with either dipping or spin coating. The thickness of the organic photoconductor is preferably as small as possible when considering the carrier mobility and the fact that light is output from the glass substrate side, and may be about 1 μm to 50 μm because it causes dielectric breakdown due to a pinhole or the like if it is excessively thin.

Figure 3A:
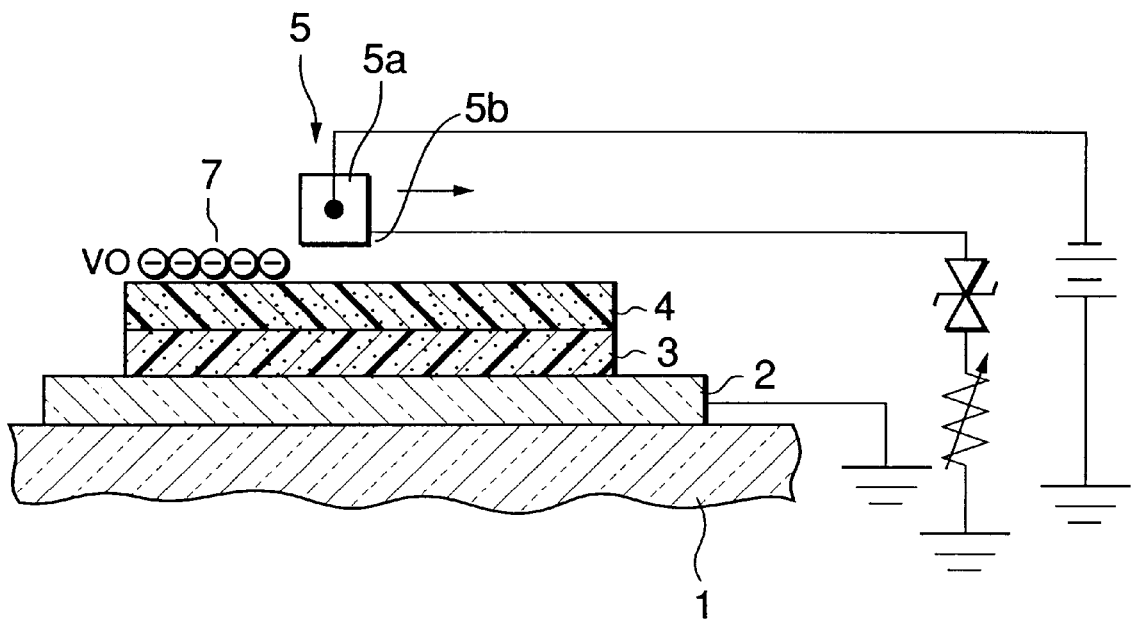
FIGS. 3 and 3B are sectional views showing the organic EL panel manufacturing process according to the embodiment of the present invention.
Figure 3B:
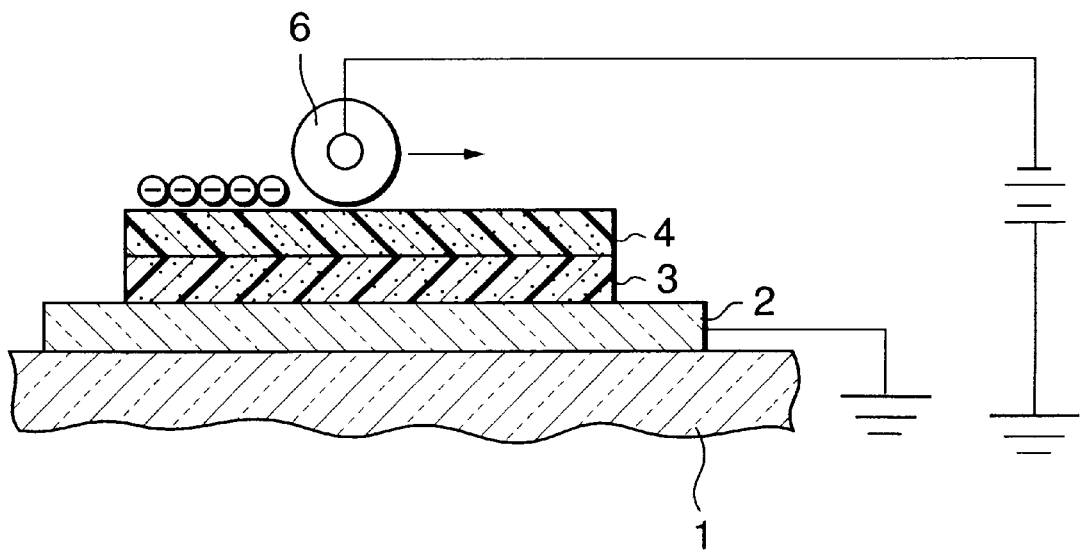

The substrate formed with the organic photoconductor is charged by using a corona charger 5, e.g., scorotron, or a contact charger 6, e.g., a brush, a blade, or a roller charger (see FIGS. 3A and 3B). A photoconductor charging potential VO changes depending on the thickness or mobility of the organic film to be formed, and is about –300 V to –1,200 V when reversal development is performed by using negatively charged toner.

Figure 4:
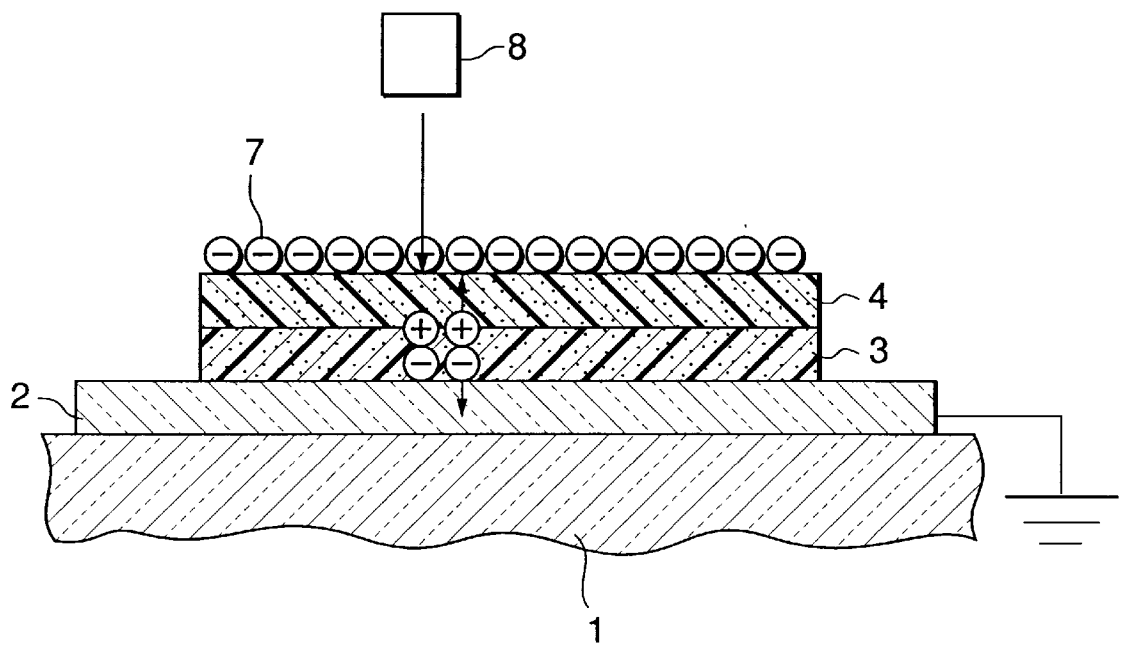
FIG. 4 is a sectional view showing the organic EL panel manufacturing process according to the embodiment of the present invention.

As shown in FIG. 4, the substrate is selectively exposed in a pattern by using an exposing unit 8, e.g., a laser or an LED, or is uniformly exposed with an LED through a photomask formed with a pattern. The wavelength of light emitted from the exposing unit 8 is in the neighborhood of 780 nm, which is the absorption wavelength of the electroluminescent medium. The laser light or the like reaches as far as the charge generation layer 3 and creates holes and electrons. The holes are injected and move in the charge transport layer 4 by the electric field which is based on the photoconductor charging potential VO, and reach the surface of the photoconductor.

Figure 5:
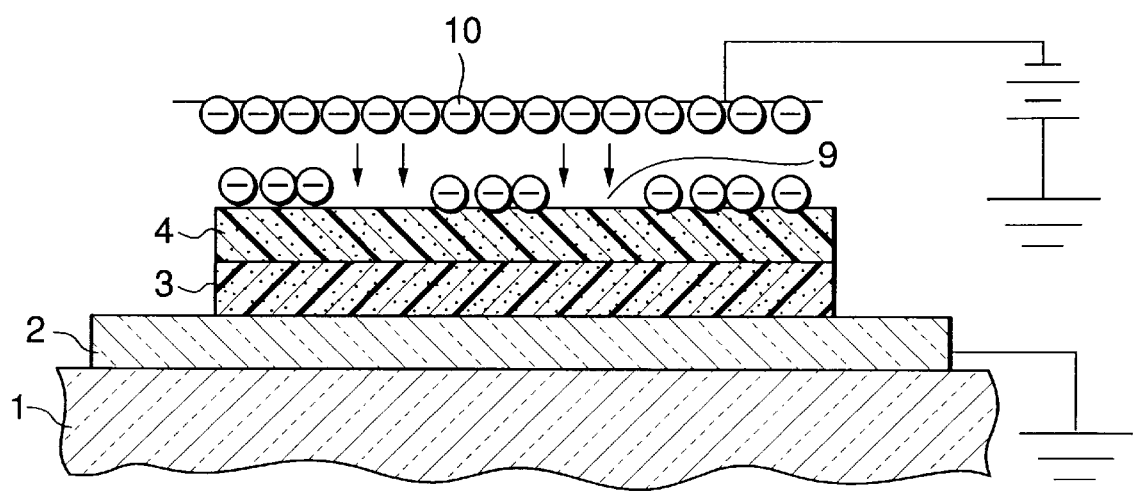
FIG. 5 is a sectional view showing the organic EL panel manufacturing process according to the embodiment of the present invention.

Subsequently, as shown in FIG. 5, the holes that have reached the surface combine with the charges to form an electrostatic latent image 9 having a latent image potential Vi. To form a comparatively rough pattern on a substrate having a large area, uniform exposure with an LED by using a photomask is effective. To form a finer pattern, laser exposure is effective.

As toner 10 to be used as a developing agent, pulverized toner which is obtained by kneading an electroluminescent medium, e.g., aluminum quinoline (tris (8-quinolilite) aluminum complex) or a dopant, in a high polymer, e.g., polyester, a styrene-acrylic copolymer, or an acrylic material, and pulverizing the mixture to an appropriate particle diameter, or polymerized toner, e.g., polyester polymerized to an appropriate particle diameter and containing an electroluminescent medium, is used.

Figure 11:
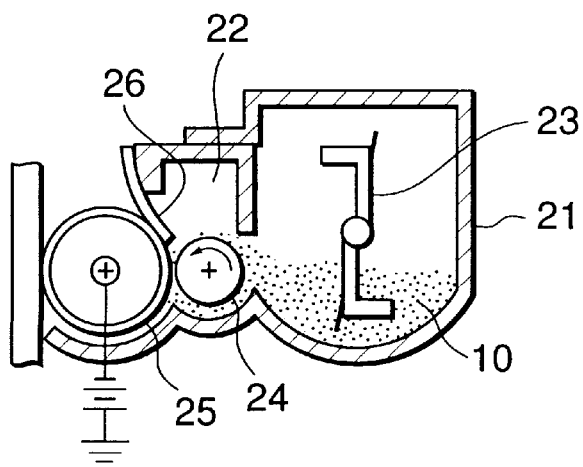

As shown in FIG. 11, a developing unit used for uniformly charging and developing the developing agent has a toner hopper 21 for storing the toner, and a developing chamber 22 for charging the toner 10 and developing the photoconductor formed with the electrostatic latent image in FIGS. 2 to 5.

The toner in the toner hopper is agitated by an agitator 23 and is supplied to a toner carrier 25 which rotates counterclockwise by a toner supplier 24 which also rotates counterclockwise in FIG. 11. The toner carrier 25 is made up of a metal roller made of, e.g., stainless steel or aluminum, and an elastic rubber material, e.g., silicone, a nytril-butadiene copolymer, or urethane rubber formed around the metal roller and imparted conductivity by ketene black or acetylene black.

The elastic portion of the toner carrier 25 is designed to have a rubber hardness of 30 to 40 degree when measured with a JIS A hardness meter considering its contact pressure against a thin layer forming member 26 and the photoconductor, and a resistance of $10^5$ Ω to $10^6$ Ω between the roller surface and the shaft considering leakage to the electrostatic latent image carrier due to the low resistance of the toner carrier 25, a decrease in developing efficiency resulting from high resistance, and fogging, so that an optimum developing efficiency is obtained. The particle diameter of the toner used in the embodiment is about 6 μm. In order to uniformly charge and convey the toner, 10-point average surface roughness Rz of the toner carrier 25 is preferably equal to or less than 10 μm.

The toner supplied to the toner carrier 25 is triboelectrified and regulated by the thin layer forming member 26 to form a uniform thin layer consisting of one to several layers. The thin layer forming member 26 is constructed by a spring made of a thin metal plate of stainless steel, phosphor bronze, or the like. The charged toner that has formed a thin layer on the toner carrier 25 is conveyed to a portion of the photosensitive body that opposes the toner carrier 25 upon rotation of the toner carrier 25, and moves to the electrostatic latent image on the surface of the photoconductor by an electric field generated by a potential difference among the surface potential VO of the photoconductor, the latent image potential Vi, and the developing bias Vb applied to the toner carrier 25, to form a toner image (see FIG. 5).

As the developing process, a regular development method in which the charging polarities of the photoconductor and toner are opposite, and a reversal development method in which the charging polarities of the photoconductor and the toner are the same, are available, and either one can be employed. To develop a comparatively wide region, the regular development method is effective; to develop a small region, the reversal development method is effective.

To fabricate a color organic EL panel, the process of charging, exposure, and development must be repeated the number of times equal to the number of required colors. If the required colors are R, G, and B, the process is repeated three times to form pixels. Since this process allows arbitrary exposure and development in a small region, the film formation order can be arbitrary.

Figure 6:
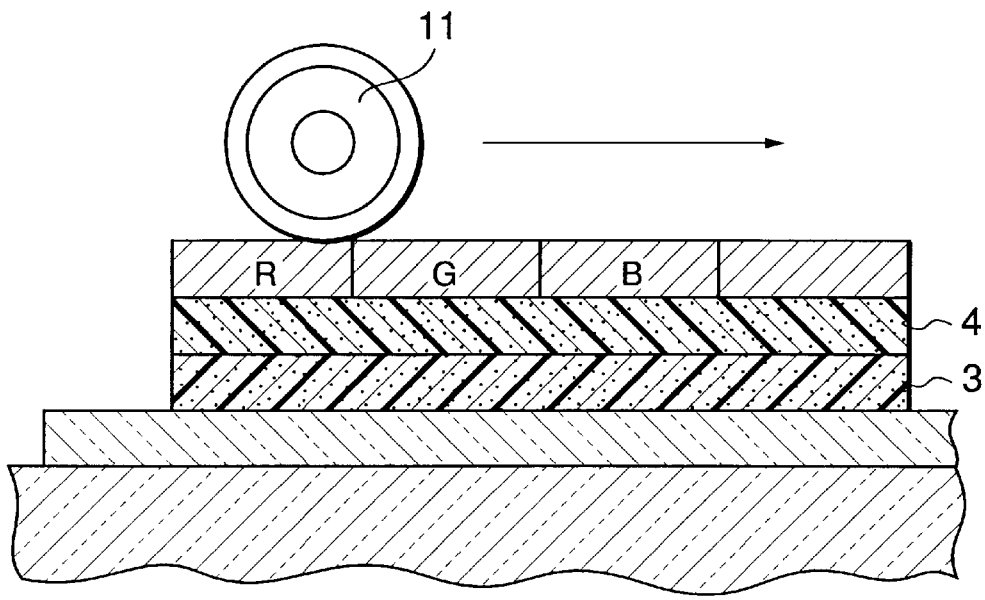
FIG. 6 is a sectional view showing the organic EL panel manufacturing process according to the embodiment of the present invention.

The developed toner is fixed on the substrate by using a fixing unit. In the fixing process, the toner is fixed by using a heat roller 11, which is obtained by coating the outer circumferential surface of an aluminum pipe incorporating a halogen lamp with a fluorine-based compound, e.g., polytetrafluoroethylene (PTFE) or polyvinylidene fluoride (PVDF) (see FIG. 6), or a xenon flash lamp. The fixing temperature differs depending on the type of binder used for the toner and is ordinarily 100° C. to 150° C.

According to another color separating and micropatterning method, the developing toner can be used as a mask when depositing an organic material, e.g., an electroluminescent medium.

More specifically, a photoconductor having a charge generation layer and a charge transport layer is formed on the transparent electrode side in accordance with the same method as described above, and this photoconductor is charged.

Figure 7:
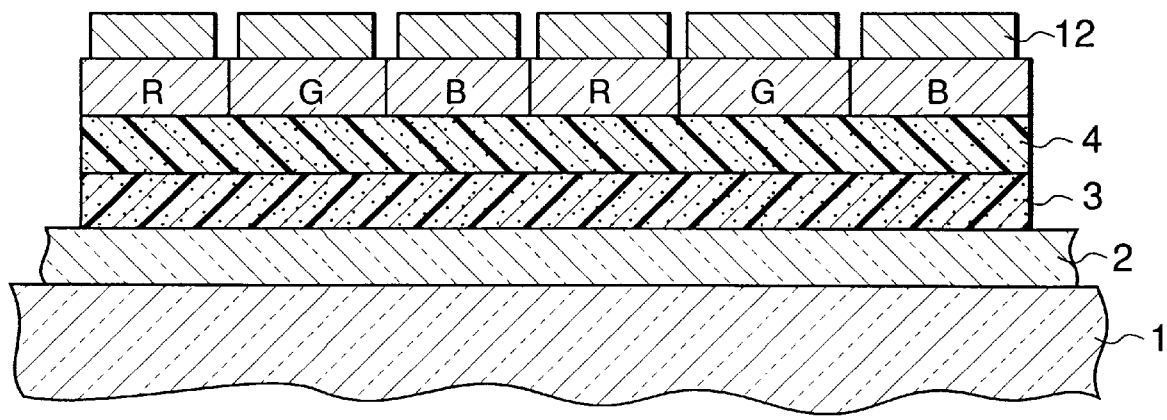
FIG. 7 is a sectional view showing the organic EL panel manufacturing process according to the embodiment of the present invention.
Figure 8:
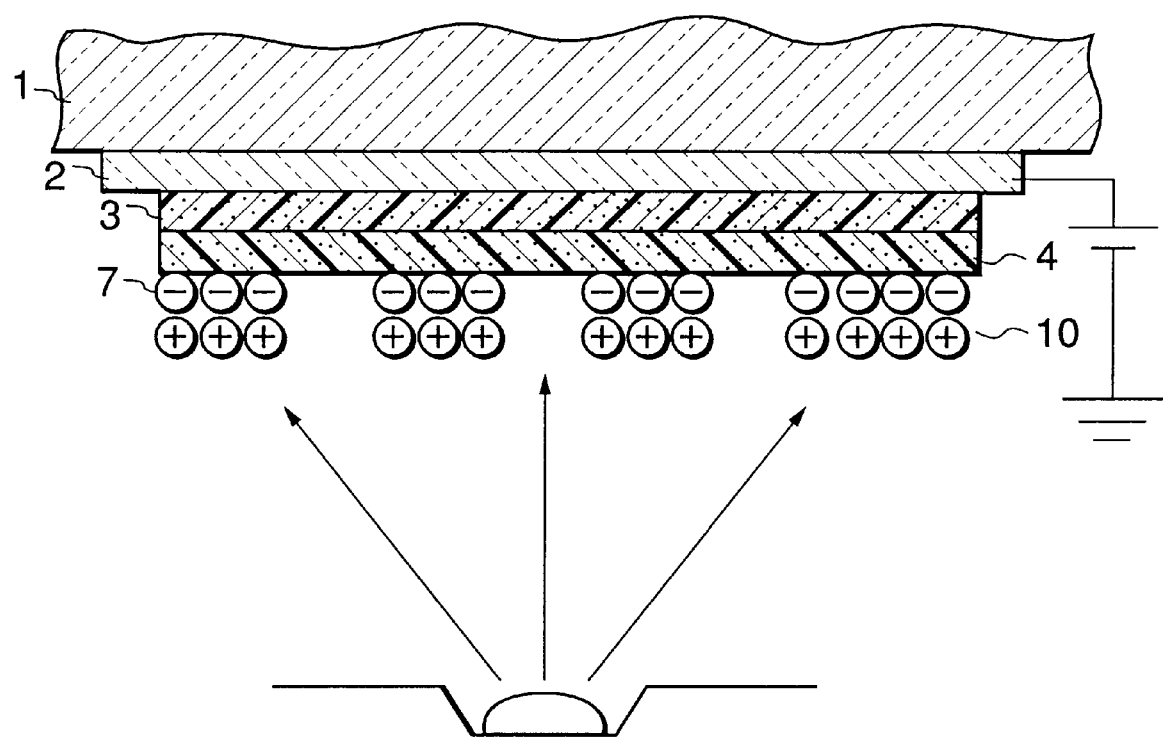
FIG. 8 is a sectional view showing the organic EL panel manufacturing process according to the embodiment of the present invention.

In the reversal development method, portions other than desired emission pixels are exposed to form an electrostatic latent image, and the electrostatic latent image is developed by using toner having the same charging polarity as that of the photoconductor. In the regular development method, desired emission pixel portions are exposed to form an electrostatic latent image, and portions other than the exposed portions are developed by using toner having a charging polarity opposite to that of the photosensitive body. By using the developed portions as the mask, an emission/electron transport layer is formed in accordance with vacuum deposition (see FIG. 7).

Figure 9A:
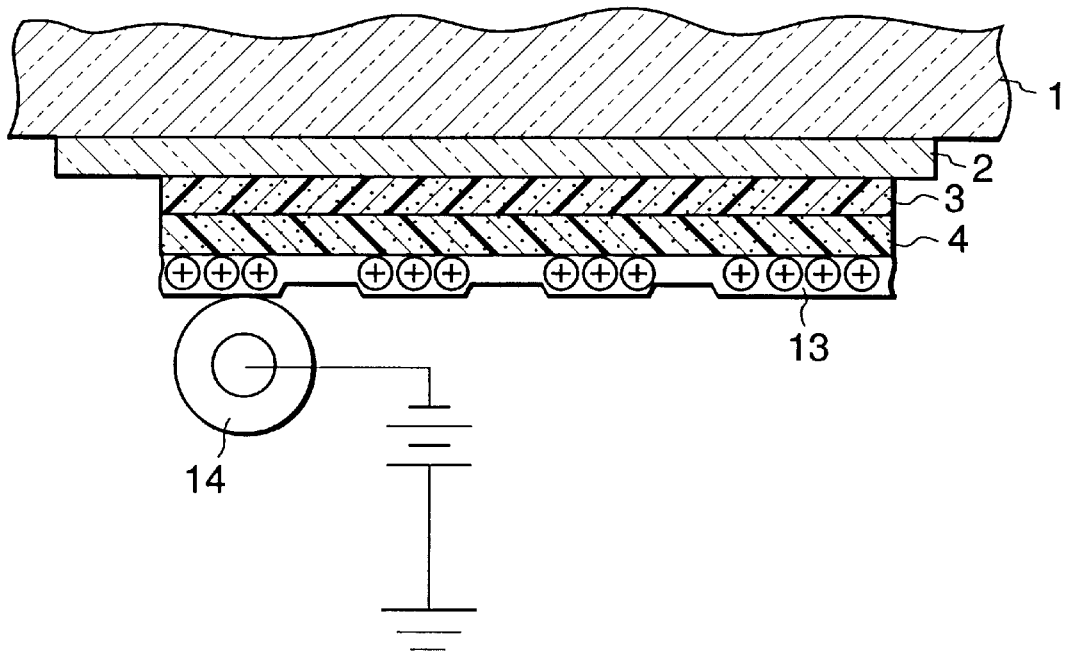
FIGS. 9A and 9B are sectional views showing the organic EL panel manufacturing process according to the embodiment of the present invention.
Figure 9B:
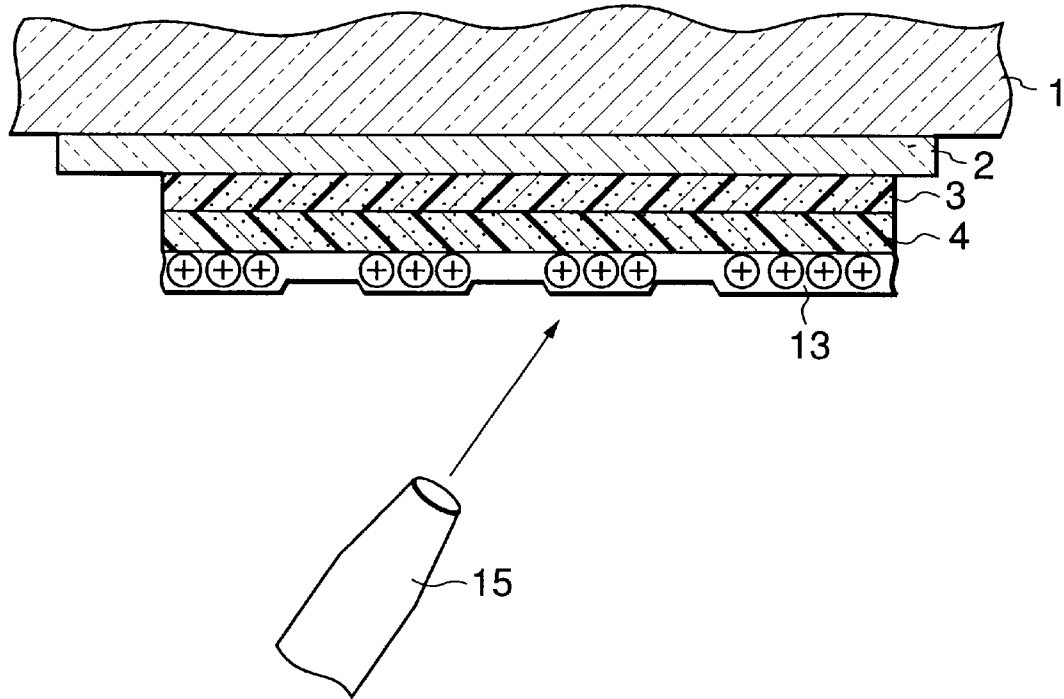

Since the toner is non-fixed, an emission/electron transport material 13 formed on the toner (developed to correspond to portions other than the emission pixels) by deposition can be removed by transferring the toner from the panel substrate by using a scorotron or a transfer roller 14 (see FIG. 9A). The emission/electron transport material 13 may be removed not by the transfer process but by blow off wherein the toner on the non-thin film portions is removed by blowing a high-pressure gas from, e.g., a blow nozzle 15 (see FIG. 9B). As the gas, an inert gas, e.g., nitrogen or argon, is used.

Mg:Ag or Li:Al are vacuum-deposited to form a cathode 13 on an emission layer 12 formed in the above process by alloying or co-deposition. An electrode wiring pattern may be formed to perpendicularly intersect the pixels by using toner which is obtained by dispersing an Mg:Ag or Li:Al alloy powder in a binder resin (see FIG. 7).

The first embodiment of the present invention will be described.

An ITO thin film having a thickness of 120 nm and a sheet resistance of 15 Ω/□ was formed as a transparent electrode on a 1.1-mm thick glass substrate by sputtering, to form an anode. To form a charge generation layer (hole injection layer) to be applied on the anode, titanyl phthalocyanine and a butyral resin were weighed to a weight ratio of 3.0:1, were dissolved in THE (tetrahydrofuran), and were dispersed by a mixer to prepare a dispersed coating liquid having a solid content of 5 wt %. This coating liquid was applied to the glass substrate by dipping, thereby forming a thin film having a thickness of 500 nm.

To form a charge transport layer (hole transport layer), TPD (triphenyldiamine derivative) and polycarbonate were weighed to a weight ratio of 2.5:1, and were dissolved in dichloromethane to prepare a dispersed coating liquid having a solid content of 3 wt %. This coating liquid dissolved in THE was applied by dipping to form a thin film having a thickness of 1,000 nm. The substrate formed with the above organic photoconductor was charged by using a contact charger employing a charge roller. The voltage applied to the charge roller was −1,100 V, and the surface potential VO to the glass substrate was −700 V under constant-voltage control.

Selective pattern exposure was performed by using a semiconductor laser. The wavelength of the exposing unit was 780 nm, which was the absorption wavelength of the electroluminescent medium. With an exposure amount of 0.3 mW/cm² and an exposure spot diameter of 10 μm, an electrostatic latent image having a latent image potential Vi=−50 V was obtained.

Regarding the toner used as a developing agent, toner obtained by kneading 5 wt % of (4-dicyanomethylene-2-methyl-6-(p-dimenthylaminostylril)-4H-pyran), (DCM) as an emission/electron transport agent in aluminum quinoline to form a polyester resin, and pulverizing the polyester resin to a centroid particle diameter of 6 μm was used as a red material. A developing bias Vb of −350 V was applied to the developing roller to perform development.

The fixing temperature of this polyester resin was 120° C. when the fixing process speed was 30 mm/sec. This toner was fixed in a non-contact manner at 120° C. by using a xenon flash lamp to obtain a red pixel pattern. Subsequently, the glass substrate fixed with the red material was charged and exposed in the same manner. As a green material, toner obtained by kneading 5 wt % of quinacridone as a dopant in aluminum quinoline to form a polyester resin having a fixing temperature of 110° C. was used, and development was performed. This toner was fixed at a fixing temperature of 110° C. to obtain a green pattern. This glass substrate was further charged and exposed, and developed by using, as a blue material, toner obtained by kneading 10 wt % of perylene derivative in aluminum quinoline to form a polyester resin having a fixing temperature of 100° C. This toner was fixed at a fixing temperature of 100° C. to obtain a blue pattern. The average charge amount of the respective toners was −15 μC/g. Since a binder resin having a high fixing temperature was used in advance, even if fixing was repeated, the color smearing or mixing did not occur, and color separation was achieved. The thickness of the fixed film of each color was 60 nm.

To form the cathode wiring pattern, Mg:Ag or Li:Al were vacuum-deposited. A panel having a dot pitch of 40 μm and a space width of 15 μm was fabricated.

The second embodiment of the present invention will be described.

In the same manner as in the first embodiment, an ITO thin film having a thickness of 120 nm and a sheet resistance of 15 Ω/□ was formed on a 1.1-mm thick glass substrate by sputtering. As a charge generation layer (hole injection layer), a 500 nm-thick titanyl phthalocyanine-dispersed film was formed on the ITO thin film.

As a charge transport layer (hole transport layer), a 1,000 nm-thick TPD-dispersed thin film was formed.

The substrate formed with the above organic photosensitive body was charged by using a scorotron to a surface potential V0 of −700 V. The applied voltage of a scorotron wire 5a was about −6 kV with DC, constant-current control as performed at 650 μA, and a voltage Vg of a grid 5b was −700 V.

Selective pattern exposure was performed by using a semiconductor laser. The wavelength, the dose, and the exposure spot diameter of the exposing unit were equal to those of the first embodiment.

Regarding the toner used as a developing agent, toner obtained by kneading 5 wt % of quinacridone as an emission/electron transport agent in aluminum quinoline to form polyester, and pulverizing the polyester to a centroid particle diameter of 6 μm was used as a green material. A developing bias Vb of −300 V was applied to the developing roller to perform development, thereby obtaining a green pixel pattern. As a blue material, toner obtained by kneading 10 wt % of perylene in aluminum quinoline to form polyester was used. As a red material, toner obtained by kneading 5 wt % of DCM in aluminum quinoline to form polyester was used. Charging, exposure, and development were performed in the same manner as that performed when obtaining the green pixels. Blue and red pixels were thus obtained. The average charge amount of the respective toners was −13 μC/g.

Finally, the respective pixel patterns were fixed at 140° C. by using a heat roller obtained by coating the outer circumferential surface of an aluminum pipe incorporating a halogen lamp with PVDF. The film thickness was 60 nm.

The second embodiment will be compared with the first embodiment. In the second embodiment, since the scorotron requires a high-voltage power supply and corona discharge is employed, ozone is generated, and so a material having an extremely low ozone resistance cannot be used. On the other hand, the number of times of the fixing process can be reduced to once, greatly simplifying the process.

To form the cathode wiring pattern, Mg:Ag were co-deposited to a thickness of 1500 Å, thereby fabricating an organic EL panel. A panel having a dot pitch of 35 μm and a space width of 10 μm was fabricated.

The third embodiment of the present invention will be described.

An ITO thin film having a thickness of 120 nm and a sheet resistance of 15 Ω/□ was formed as a transparent electrode on a 1.1-mm thick glass substrate by sputtering, to form an anode. To form a charge generation layer (hole injection layer), copper phthalocyanine and a butyral resin were weighed to a weight ratio of 3.0:1, were dissolved in THE (tetrahydrofuran), and were dispersed by a mixer to prepare a dispersed coating liquid having a solid content of 5 wt %. This coating liquid was applied to the glass substrate formed with the ITO thin film by spin coating, thereby forming a thin film having a thickness of 400 nm.

To form a charge transport layer (hole transport layer), α-NPD (a-naphthyl-diphenyl-diamine derivative) and polycarbonate were weighed to a weight ratio of 2.5:1, and were dissolved in dichloromethane to prepare a dispersed coating liquid having a solid content of 2 wt %. This coating liquid was applied to the glass substrate by spin coating to form a thin film having a thickness of 800 nm.

A photoconductor bias VOPC of 150 V was applied to the ITO film on the substrate formed with the above organic photosensitive body. A grid potential Vg was set to −750 V, and the photoconductor was charged by using a scorotron. The charging potential V0 as a sum with the photoconductor bias was −600 V.

Desired pixel pattern portions were selectively exposed by using a semiconductor laser. The exposing potential was −30 V. A photoconductor bias was applied to form an electrostatic latent image having a latent image potential Vi=120 V.

Regarding the developing agent, spheroidal polymerized toner obtained by mixing a positive-charging charge control agent (CCA), e.g., nigrosine dye or quaternary ammonium salt, during polymerization of a styrene-acrylic copolymer and having a centroid particle diameter of 6 μm and an average charge amount of 15 μC/g was used. Development was performed by applying a developing bias Vb of 150 V, so that the developing toner was attached to a substrate portion other than the pixels.

Figure 10:
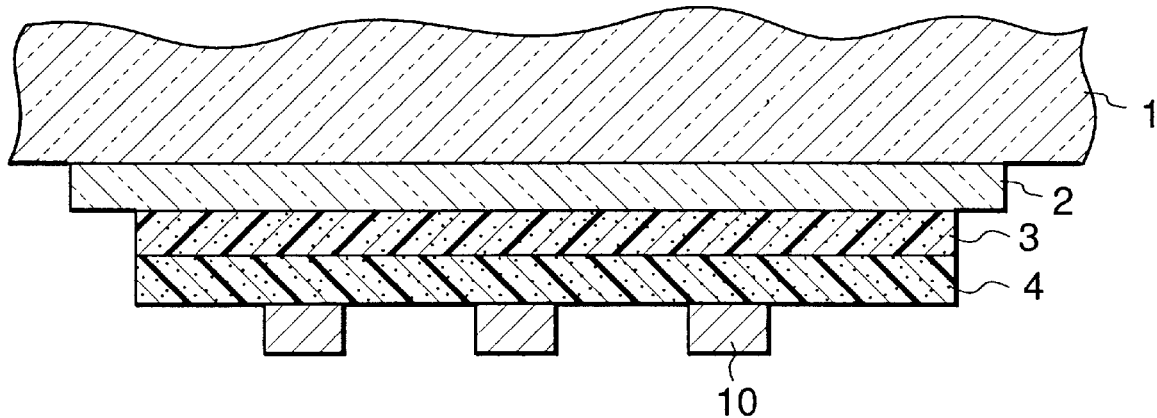
FIG. 10 is a sectional view showing the organic EL panel manufacturing process according to the embodiment of the present invention and FIG. 11 is a sectional view of a developing machine used in the manufacture of the organic EL panel according to the embodiment of the present invention.

Three wt % of quinacridone as a dopant, and aluminum quinoline of the green material that forms an emission layer, were co-deposited to a thickness of 30 nm. Subsequently, aluminum quinoline was deposited to a thickness of 300 Å as an electron transport layer. After a green pattern was formed, the toner developed on the substrate was removed from the substrate by using a transfer roller 14 and by applying a transfer bias Vp of −400 V (see FIG. 10).

Al:Li were co-deposited to a thickness of 300 Å, and thereafter only aluminum was deposited to a thickness of 1,700 Å to form a cathode, thereby fabricating an organic EL panel. A panel having a dot pitch of 40 μm and a space width of 10 μm was fabricated.

A comparative example as a prior art will be described to compare the present invention with the prior art.

In this comparative example, when compared to the embodiment of the present invention, an ITO thin film having a thickness of 120 nm and a surface resistance of 15 Ω/□ was formed as a transparent electrode on a 1.1-mm thick glass substrate by sputtering, thereby forming an anode. As a hole injection/transport layer, 50 nm-thick α-NPD was formed on the anode by vacuum deposition. An aluminum quinoline complex and quinacridone as a dopant were co-deposited as a green emission layer, an aluminum quinoline complex and 10% of perylene were co-deposited as a blue emission layer, and aluminum quinoline and 5% of DCM as a dopant were co-deposited as a red material, each to a thickness of 25 nm. Subsequently, as an electron transport layer, an aluminum quinoline complex was deposited to a thickness of 30 nm by sliding the metal mask, thereby achieving color separation among green, blue and red.

By using the metal mask, Al:Li were co-deposited to a thickness of 300 Å. Thereafter, only aluminum was deposited to a thickness of 1,700 Å, thereby forming a cathode. An organic EL panel was thus fabricated. With this color separation method using the mask as the prior art, a panel having a dot pitch of 80 μm and a space width equal to or less than 40 μm was difficult to fabricate.

What is claimed is:

1. A method of manufacturing an organic EL panel in which an organic electroluminescent material is formed between a pair of opposing electrodes at least one of which is transparent or opaque, wherein an emission pixel is obtained through the steps of forming a photoconductor having a charge generation layer and a charge transport layer on a transparent electrode side, charging the photoconductor and thereafter exposing the photoconductor to form an electrostatic latent image at an emission pixel portion, developing the electrostatic latent image by using toner kneaded with an electroluminescent medium, and fixing the toner on the photoconductor after development.

2. A method according to claim 1, wherein the transparent electrode is an ITO film.

3. A method of manufacturing an organic EL panel in which an organic electroluminescent material is formed between a pair of opposing electrodes at least one of which is transparent or opaque, wherein an emission pixel is obtained through the steps of forming a photoconductor having a charge generation layer and a charge transport layer on a transparent electrode side, charging the photoconductor and thereafter exposing the photoconductor to form an electrostatic latent image at a portion other than an emission pixel portion, developing the electrostatic latent image by using toner kneaded with an electroluminescent medium, forming a pixel portion by deposition while using a developed portion as a mask, and removing the toner used as the mask from a panel substrate after deposition to obtain the emission pixel.

4. A method according to claim 3, wherein the transparent electrode is an ITO film.

* * * * *